US012719432B2

(12) United States Patent
Jiang et al.

(10) Patent No.: US 12,719,432 B2
(45) Date of Patent: Aug. 25, 2026

(54) VOLTAGE REGULATOR WITH SKEWED CURRENT MIRROR

(71) Applicant: QUALCOMM Incorporated, San Diego, CA (US)

(72) Inventors: Jize Jiang, Singapore (SG); Hua Guan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 231 days.

(21) Appl. No.: 18/610,956

(22) Filed: Mar. 20, 2024

(65) Prior Publication Data

US 2025/0300617 A1 Sep. 25, 2025

(51) Int. Cl.
*G05F 1/575* (2006.01)
*G05F 3/26* (2006.01)
*H03F 3/45* (2006.01)

(52) U.S. Cl.
CPC ......... *H03F 3/45748* (2013.01); *G05F 1/575* (2013.01); *G05F 3/262* (2013.01); *H03F 3/45273* (2013.01)

(58) Field of Classification Search
CPC ................................ G05F 1/575; G05F 3/262
See application file for complete search history.

(56) References Cited

U.S. PATENT DOCUMENTS 9,740,225 B1 8/2017 Wong
10,545,523 B1 1/2020 Wu et al.
11,632,838 B2 4/2023 Sun et al.
2019/0235550 A1* 8/2019 Zhang ........................ H03L 7/08
2023/0198394 A1* 6/2023 Jiang ......................... G05F 3/26 323/282
2024/0319755 A1* 9/2024 Jiang ....................... G05F 1/575

FOREIGN PATENT DOCUMENTS

JP 2016015076 A 1/2016

OTHER PUBLICATIONS

Co-pending U.S. Appl. No. 18/188,891, inventor Jiang; Jize, filed Mar. 23, 2023.
Shi C., et al., "A Highly Integrated Power Management IC for Advanced Mobile Applications", IEEE Journal of Solid-State Circuits, vol. 42, No. 8, Aug. 2007, pp. 1723-1731.
International Search Report and Written Opinion—PCT/US2025/020429—ISA/EPO—Jun. 17, 2025.

* cited by examiner

*Primary Examiner* — Sisay G Tiku
(74) *Attorney, Agent, or Firm* — Gerald P. Joyce, III

(57) ABSTRACT

Techniques and apparatus for supplying power with offset voltage generation are provided. One example power supply circuit generally includes a first transistor including a source coupled to an input voltage (Vin) node and a drain coupled to an output voltage (Vout) node, a second transistor including a drain coupled to a gate of the first transistor, a third transistor including a drain coupled to the drain of the second transistor and to the gate of the first transistor, where a source of the third transistor is coupled to a reference potential node of the power supply circuit, an amplifier including a first input coupled to a reference voltage (Vref) node and an output coupled to a gate of the third transistor, and a voltage offset circuit coupled between the gate of the first transistor and a gate of the second transistor.

16 Claims, 5 Drawing Sheets

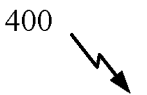

402

Drive a gate of a first transistor to control a first current in a first branch of a current mirror

404

Generate an offset voltage between a gate and a drain of a second transistor in the first branch of the current mirror

406

Generate a second current in a second branch of the current mirror based on the first current, wherein a gate voltage of a third transistor in the second branch of the current mirror is higher than a gate voltage of the second transistor by the offset voltage

FIG. 4

VOLTAGE REGULATOR WITH SKEWED CURRENT MIRROR

TECHNICAL FIELD

Certain aspects of the present disclosure generally relate to electronic circuits and, more particularly, to a power supply circuit and techniques for voltage regulation.

BACKGROUND

A voltage regulator ideally provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A linear regulator may be implemented by a low-dropout (LDO) regulator, for example. A switching regulator (also known as a "switching converter" or "switcher") may be implemented, for example, by a switched-mode power supply (SMPS), such as a buck converter, a boost converter, a buck-boost converter, or a charge pump.

Power management integrated circuits (power management integrated circuits (ICs) or PMICs) are used for managing the power demands of a host system and may include and/or control one or more voltage regulators (e.g., boost converters). A PMIC may be used in battery-operated devices, such as mobile phones, tablets, laptops, wearables, etc., to control the flow and direction of electrical power in the devices. The PMIC may perform a variety of functions for the device such as DC-to-DC conversion, voltage regulation, battery charging, power-source selection, voltage scaling, power sequencing, etc. For example, a PMIC may feature an LDO regulator for voltage regulation.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide a power supply circuit. The power supply circuit generally includes: a first transistor including a source coupled to an input voltage (Vin) node and a drain coupled to an output voltage (Vout) node; a second transistor including a drain coupled to a gate of the first transistor; a third transistor including a drain coupled to the drain of the second transistor and to the gate of the first transistor, wherein a source of the third transistor is coupled to a reference potential node of the power supply circuit; an amplifier including a first input coupled to a reference voltage (Vref) node and an output coupled to a gate of the third transistor; and a voltage offset circuit coupled between the gate of the first transistor and a gate of the second transistor.

Certain aspects of the present disclosure provide a wireless device including the power supply circuit described herein.

Certain aspects of the present disclosure provide a wearable device including the power supply circuit described herein.

Certain aspects of the present disclosure provide an Internet of Things (IoT) device including the power supply circuit described herein.

Certain aspects of the present disclosure provide an integrated circuit (IC) including the power supply circuit (or at least a portion of the power supply circuit) described herein.

Certain aspects of the present disclosure are directed to a method of supplying power. The method generally includes driving a gate of a first transistor to control a first current in a first branch of a current mirror, generating an offset voltage between a gate and a drain of a second transistor in the first branch of the current mirror, and generating a second current in a second branch of the current mirror based on the first current, wherein a gate voltage of a third transistor in the second branch of the current mirror is higher than a gate voltage of the second transistor by the offset voltage.

Certain aspects of the present disclosure provide a low-dropout (LDO) voltage regulator. The LDO voltage regulator generally includes a skewed current mirror, wherein the skewed current mirror is configured to have an offset voltage between a gate of a first transistor in a first branch of the skewed current mirror and a gate of a second transistor in a second branch of the skewed current mirror, and the second transistor is a pass transistor of the LDO voltage regulator.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 4 is a flow diagram illustrating example operations for supplying power, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide techniques and apparatus for supplying power using a linear voltage regulator (e.g., a low-dropout (LDO) regulator) implemented with a voltage offset circuit. Such a voltage regulator may include a current-mirror-based gate driver configured to drive a pass transistor of the voltage regulator. The voltage offset circuit may be included in the current mirror and may be configured to generate an offset voltage to effectively offset a gate voltage of a reference transistor of the current mirror from a gate voltage of the pass transistor.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

Figure 1:
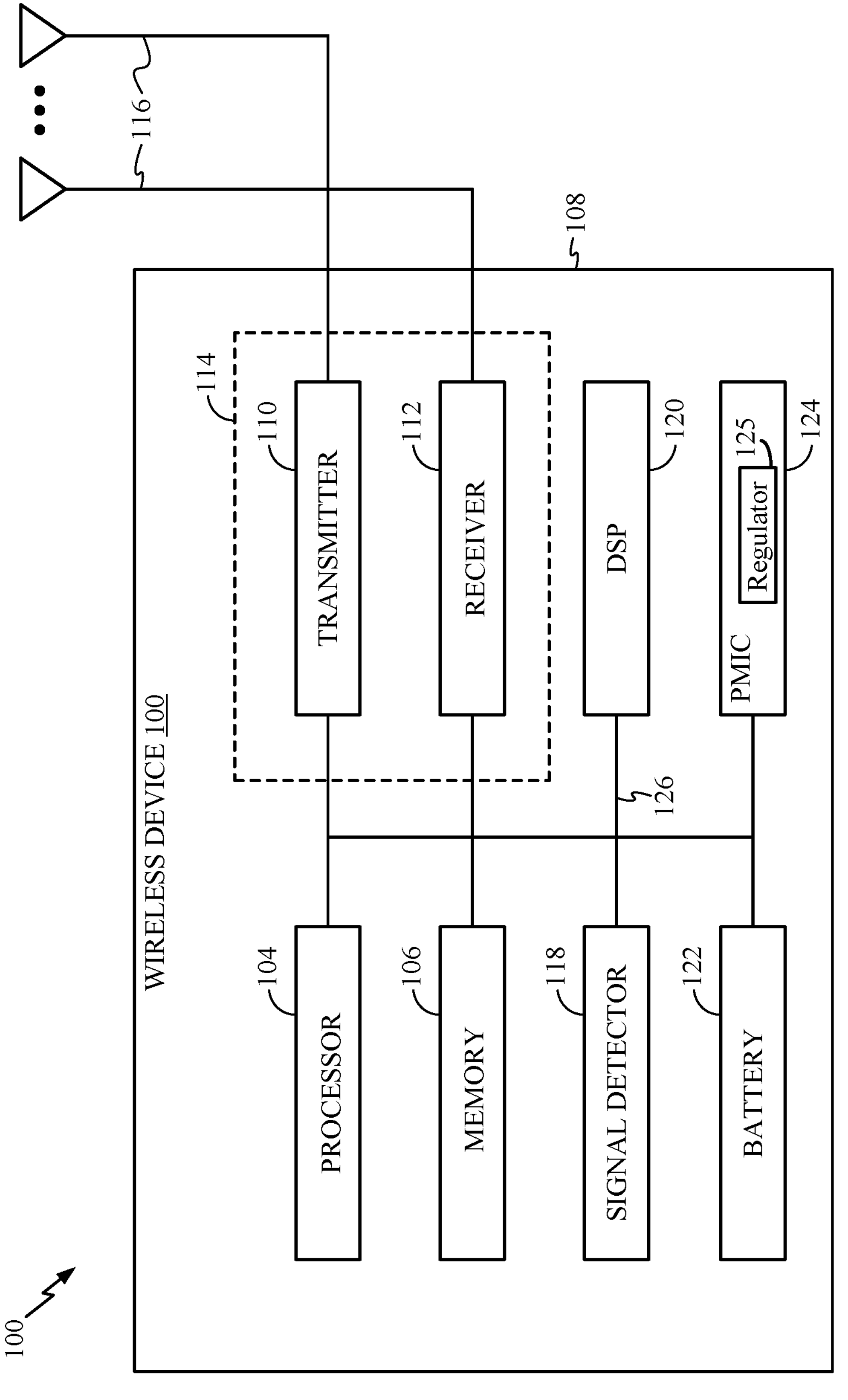
FIG. 1 is a block diagram of an example device that includes a voltage regulator, in which aspects of the present disclosure may be implemented.

FIG. 1 illustrates an example device 100 that includes a voltage regulator 125, in which aspects of the present disclosure may be implemented. The device 100 may be a battery-operated device such as a cellular phone, a personal digital assistant (PDA), a handheld device, a wireless modem, a smartphone, a tablet, a laptop computer, a personal computer, a wearable device, an Internet of Things (IoT) device, an augmented reality device, etc. The device 100 is an example of a device that may be configured to implement the various systems and methods described herein.

The device 100 may include a processor 104 which controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The device 100 may also include a transmitter 110 and/or a receiver 112 to allow transmission and/or reception, respectively, of data between the device 100 and a remote location. In some cases, the transmitter 110 and receiver 112 may be combined into a transceiver 114. One or more antennas 116 may be attached or otherwise coupled to a housing 108 of the device 100 and electrically coupled to the transceiver 114. For certain aspects, the device 100 may also include multiple transmitters, multiple receivers, and/or multiple transceivers (not shown).

The device 100 may also include a signal detector 118 that may be used in an effort to detect and quantify the level of signals received by the transceiver 114. The signal detector 118 may detect such signals as total energy, energy per subcarrier per symbol, and power spectral density, among others. The device 100 may also include a digital signal processor (DSP) 120 for use in processing signals.

The device 100 may further include a battery 122, which may be used to power the various components of the device 100 (e.g., when another power source-such as a wall adapter or a wireless power charger-is unavailable). The battery 122 illustrated in FIG. 1 may represent multiple portable power sources, such as a main battery and a backup battery (or a supercapacitor). In some cases, the battery 122 may be rechargeable.

The device 100 may also include a power management integrated circuit (IC) (or PMIC) 124 for managing the power from the battery 122 (or batteries), a wall adapter, and/or a wireless power charger to the various components of the device 100. The PMIC 124 may perform a variety of functions for the device such as DC-to-DC conversion, voltage regulation (e.g., with the voltage regulator 125) battery charging, power-source selection, voltage scaling, power sequencing, etc. In certain aspects, the voltage regulator 125 may be a low-dropout (LDO) regulator implemented using a voltage offset circuit, as described herein.

The various components of the device 100 may be coupled together by a bus system 126. The bus system 126 may include a power bus, a control signal bus (e.g., system power management interface (SPMI) or inter-integrated circuit ($I^2C$) bus), and a status signal bus in addition to a data bus. Additionally or alternatively, various combinations of the components of the device 100 may be coupled together by one or more other suitable techniques.

Example LDO Regulator

Figure 2:
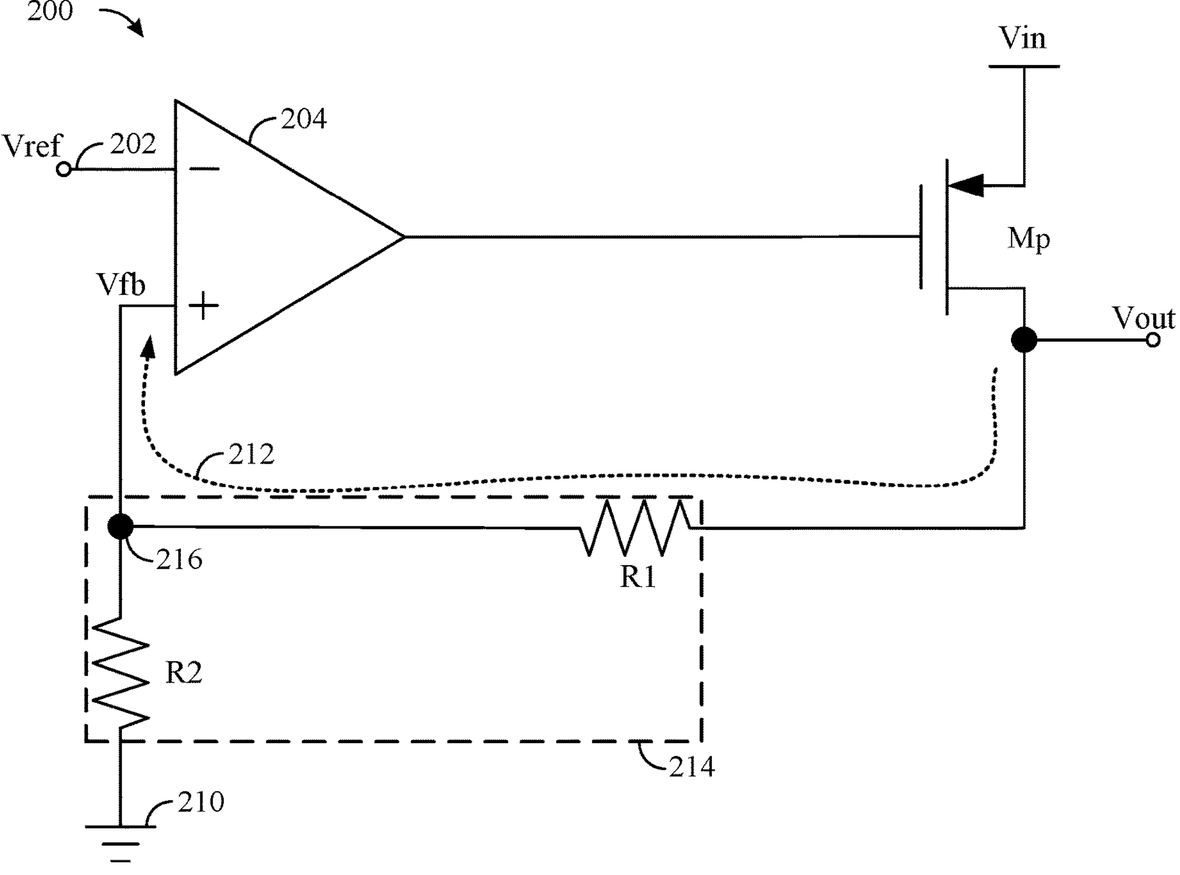
FIG. 2 is a circuit diagram of an example low-dropout (LDO) regulator, in which aspects of the present disclosure may be implemented.

FIG. 2 is a circuit diagram of an example LDO regulator 200, in which aspects of the present disclosure may be implemented. The LDO regulator 200 may include an amplifier 204 (e.g., an error amplifier (EA)) having an output coupled to a gate of a transistor Mp (e.g., a power field-effect transistor (FET), which may be a p-type transistor (as shown) or an n-type transistor). Also referred to as the "pass transistor," transistor Mp may have a source coupled to an input voltage (Vin) node and a drain coupled to an output voltage (Vout) node. The LDO regulator 200 may also include a feedback path 212 coupled between the Vout node and a positive input of the amplifier 204. The feedback path 212 may include a voltage divider 214 (e.g., resistive elements R1, R2) coupled between the Vout node and a reference potential node 210 (e.g., electrical ground), where a tap 216 of the voltage divider is coupled to the positive input of the amplifier 204 to provide a feedback voltage (Vfb) to the amplifier, as illustrated.

The negative input of the amplifier 204 may be coupled to a reference voltage node 202 configured to have a reference voltage (Vref), which is ideally provided by a stable reference source. During operation of the LDO regulator 200, the amplifier 204 drives transistor Mp to keep Vfb equivalent to Vref. In this manner, the output voltage of the LDO regulator 200 at the Vout node is regulated, despite fluctuations in the input voltage at the Vin node. The Vout node may act as a power supply rail with a regulated voltage for one or more other circuits (not shown).

Example Low $I_Q$ Voltage Regulator

Figure 3A:
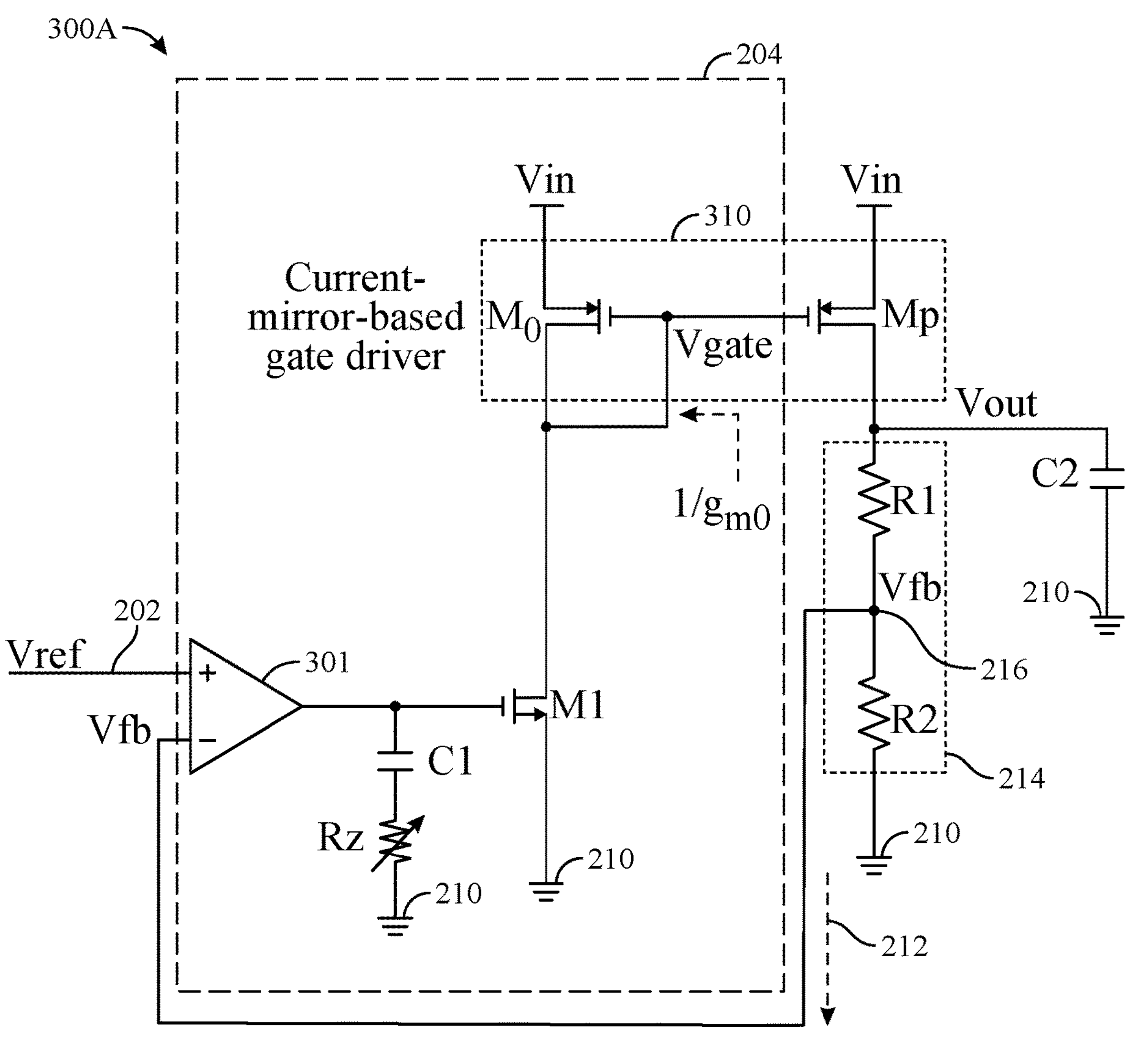
FIG. 3A is a circuit diagram of an example low quiescent current (IQ) LDO regulator, in which aspects of the present disclosure may be implemented.

FIG. 3A is a circuit diagram of an example low quiescent current ($I_Q$) LDO regulator (e.g., LDO regulator 300A), in which aspects of the present disclosure may be implemented. In the LDO regulator 300A, the amplifier 204 may be implemented as a two-stage amplifier, having an input stage (also referred to as a "transconductance stage") and an output stage. The input stage may be represented by an amplifier 301, which may include a differential pair of input transistors (not shown), which may be coupled to an active load (not shown) and to the output stage. The output stage may include a transistor M1 and a transistor M0 (also referred to as a "driver transistor" or "reference transistor"). The topology for this output stage provides low $I_Q$ for the LDO regulator 300A.

As illustrated, the amplifier 301 may have a positive input coupled to the reference voltage node 202 and a negative input coupled to the feedback path 212 (e.g., to the tap 216 of the voltage divider 214). The amplifier 301 may also have an output coupled to a gate of transistor M1. A capacitive element C1 and a resistive element Rz (which may be a variable load-tracking resistive element) may be coupled in shunt between the output of the amplifier 301 and the reference potential node 210. A source of transistor M1 may be coupled to the reference potential node 210, and a drain of transistor M1 may be coupled to a drain of transistor M0, to a gate of transistor M0, and to a gate of transistor Mp at a gate voltage (Vgate) node. A source of transistor M0 and a source of transistor Mp may be coupled to a power supply rail (e.g., the Vin node). The drain of transistor Mp may be coupled to the Vout node and to the voltage divider 214. A capacitive element C2 may be coupled in shunt between the Vout node and the reference potential node 210.

Transistor M0 and transistor Mp may collectively function as a current mirror 310. The current mirror 310 may include a first branch (e.g., comprising transistor M0) and a second branch (e.g., comprising transistor Mp). The current mirror 310 may function (and be referred to) as a current-mirror-based gate driver. In this manner, transistor M0 of the current-mirror-based gate driver may be configured to drive the relatively large gate capacitance (e.g., the gate-to-drain capacitance ($C_{gd}$) and the gate-to-source capacitance ($C_{gs}$)) of the power transistor (transistor Mp), based on an output of the amplifier 301. In other words, the amplifier 301 drives transistor M1 to control the reference current through transistor M0, which in turn, drives the gate (and the gate capacitance) of transistor Mp, to keep Vfb equal to Vref (at least within an offset voltage of the amplifier 204).

The current mirror 310 may have a large mirror ratio (e.g., 100, 1000, or the like, which is also referred to as a "transistor size ratio" between transistor Mp and transistor M0), such that a current (e.g., reference current for the current mirror) through transistor M0 is effectively amplified at transistor Mp. The current-mirror-based gate driver may offer an inherent adaptive bias, in which the driver provides more current with a heavier load. In other words, the quiescent current increases with load current and may be extremely low under light load conditions.

Transistor M0 may be implemented as a diode-connected transistor, and the impedance looking into the gate of transistor M0 may be the inverse of the transconductance ($g_{m0}$) of transistor M0, as illustrated. The $g_{m0}$ of transistor M0 (and hence, the impedance at the Vgate node) varies significantly with respect to the current through transistor Mp. In this manner, when the current through transistor Mp is high (e.g., during heavy load conditions), the $g_{m0}$ of transistor M0 is also high, and thus, $1/g_{m0}$ is small, which results in low impedance at the Vgate node. As a result, the pole at the Vgate node may be pushed to a higher frequency, which expands the bandwidth of the LDO regulator 300A, improving performance of the LDO regulator 300A during heavy load conditions.

However, utilizing the current-mirror-based gate driver in the LDO regulator 300A may result in challenges when operating under light load conditions. When the current flowing through transistor Mp is small (i.e., a light load), the $g_{m0}$ at transistor M0 will also be small, and thus, $1/g_{m0}$ is large, which results in high impedance at the Vgate node (limiting the ability of the current-mirror-based gate driver to drive transistor Mp, as a result of the relatively large gate capacitance of transistor Mp). Thus, the pole at the Vgate node may be moved to a lower frequency, which narrows the bandwidth of the LDO regulator 300A and worsens transient performance of the LDO regulator 300A during light load conditions. For example, when a load attack happens, the LDO regulator 300A may be unable to respond quickly, which may cause a load crash in the LDO regulator 300A. In addition, the pole at the Vgate node may fall in a loop bandwidth for the LDO regulator 300A, which may lead to instability.

Example Low $I_Q$ Voltage Regulator with a Voltage Offset Circuit

To overcome these challenges, certain aspects of the present disclosure provide an LDO regulator implementation capable of reducing the impedance at the Vgate node during light load conditions while maintaining desired transient performance and low $I_Q$ using a voltage offset circuit.

Figure 3B:
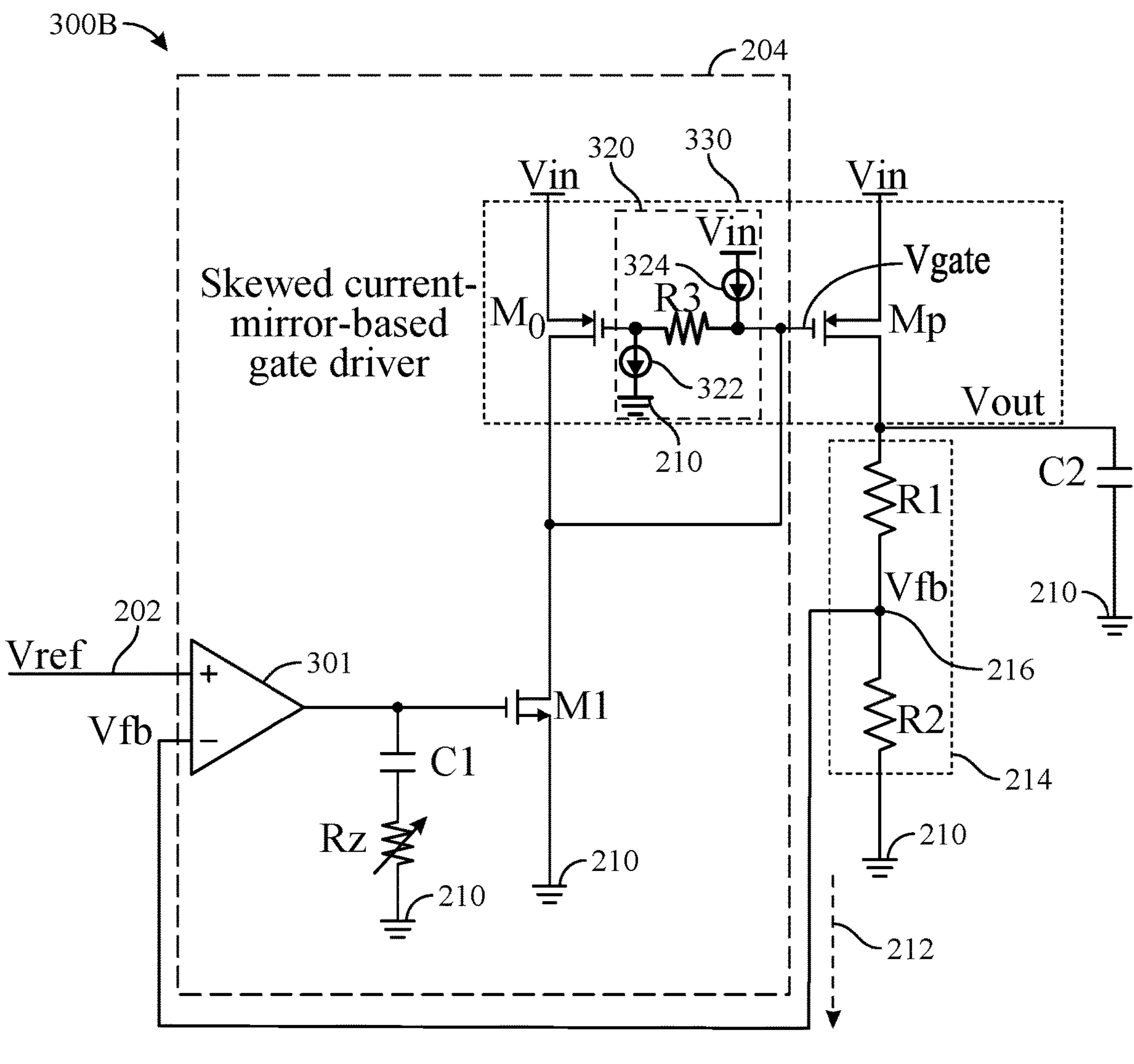
FIG. 3B is a circuit diagram of an example low IQ LDO regulator implemented with a voltage offset circuit, in accordance with certain aspects of the present disclosure.

FIG. 3B is a circuit diagram of an example low $I_Q$ LDO regulator 300B implemented with a voltage offset circuit 320, in accordance with certain aspects of the present disclosure. The LDO regulator 300B may be similar to the LDO regulator 300A, but the current mirror 310 may be implemented with the addition of the voltage offset circuit 320, plus associated circuitry and connections. The current mirror 310 implemented with the voltage offset circuit 320 is referred to herein as a "skewed current mirror 330." The skewed current mirror 330 may function (and be referred to) as a "skewed current-mirror-based gate driver."

The voltage offset circuit 320 may be coupled between the gate of transistor Mp and the gate of transistor M0 (where the drain of transistor M0 is shorted or otherwise coupled to the gate of transistor Mp), and may include a resistive element R3 and at least one of a current sink 322 or a current source 324, as illustrated. The resistive element R3 may be coupled between the gate of transistor Mp and the gate of transistor M0. A first terminal of the current sink 322 may be coupled to the gate of transistor M0 and a first terminal of the resistive element R3, and a second terminal of the current sink 322 may be coupled to the reference potential node 210. A first terminal of the current source 324 may be coupled to the Vin node (or another power supply rail), and a second terminal of the current source 324 may be coupled to a second terminal of the resistive element R3, the gate of transistor Mp, and the drains of transistor M0 and transistor M1. As such, a bias current pulled by the current source 324 will flow through the resistive element R3 and into the current sink 322, without impacting other current flow in the LDO regulator 300B. In other aspects, the current sink 322 or the current source 324 may be replaced by a resistive element or another suitable component.

With current flowing through resistive element R3, the voltage offset circuit 320 may be configured to generate an offset voltage to effectively offset a gate voltage of transistor M0 from a gate voltage of transistor Mp (i.e., the gate voltage of transistor M0 is level shifted down from the gate voltage of transistor Mp by the offset voltage). The amount of offset voltage generated by the voltage offset circuit 320 may be dependent on the resistive element R3, the current sink 322, and/or the current source 324. The transconductance is proportional to the overdrive voltage. When the LDO regulator 300B is operating during light load conditions and the voltage offset circuit 320 generates an offset voltage, the gate-to-source voltage (Vgs) of transistor Mp approaches zero (or at least becomes very small), whereas the Vgs of transistor M0 is (nearly) equal to the offset voltage. In this manner, transistor M0 remains active, current continues to flow through transistor M0, the $g_{m0}$ of transistor M0 remains elevated (proportional to the overdrive voltage), and thus, impedance at the Vgate node, which is equal to $1/g_{m0}$, is low. As a result, the pole at Vgate may be pushed to a higher frequency, which expands the bandwidth of the LDO regulator 300B and enables good transient performance for the LDO regulator 300B during light load conditions. In certain aspects, the offset voltage generated by the voltage offset circuit 320 may be sufficiently high such that the pole may be outside a loop bandwidth for the LDO regulator 300B, avoiding a stability issue.

In one example, during light load operation, the overdrive voltage ($V_{od}$) of transistor M0 may be small, such as 10 mV. In this example, the voltage offset circuit 320 may generate an offset voltage of 200 mV, such that the gate voltage of transistor M0 is shifted down 200 mV, and the $V_{od}$ is increased by 200 mV. As a result, the $g_{m0}$ of transistor M0 may be increased twentyfold (resulting in a low impedance at the Vgate node), and the pole at the Vgate node may be pushed to a frequency twenty times higher (thereby expanding the bandwidth of the LDO regulator 300B and enabling good transient performance for the LDO regulator 300B).

Transistor M0 and transistor Mp may be the same transistor type (e.g., each implemented by a p-type metal-oxide-semiconductor field-effect transistor (MOSFET)) and may be disposed adjacent to each other (e.g., in close proximity). In this manner, transistor M0 and transistor Mp may track with process, voltage, and temperature (PVT), therefore providing the LDO regulator 300B with robust performance across PVT variations. Thus, the skewed current mirror 330 with the voltage offset circuit 320 may solve the light load stability issue and provide a PVT-and-load-current-aware gate driver.

Example Operations for Supplying Power

FIG. 4 is a flow diagram illustrating example operations 400 for supply power, in accordance with certain aspects of the present disclosure. The operations 400 may be performed, for example, by a power supply circuit, such as the LDO regulator 300B of FIG. 3B.

The operations 400 may include, at block 402, the power supply circuit driving a gate of a first transistor (e.g., transistor M1) to control a first current in a first branch (e.g., comprising transistor M0) of a current mirror (e.g., skewed current mirror 330).

At block 404, the power supply circuit may generate an offset voltage between a gate and a drain of a second transistor (e.g., transistor M0) in the first branch of the current mirror. In certain aspects, generating the offset voltage at block 404 may include at least one of sinking or sourcing a bias current through a resistive element (e.g., resistive element R3) coupled between the gate and the drain of the second transistor.

At block 406, the power supply circuit may generate a second current in a second branch (e.g., comprising transistor Mp) of the current mirror based on the first current. A gate voltage of a third transistor (e.g., transistor Mp) in the second branch of the current mirror may be higher than a gate voltage of the second transistor by the offset voltage (e.g., as a result of the offset voltage).

According to certain aspects, the operations 400 may further include voltage dividing a drain voltage of the third transistor to generate a feedback voltage (e.g., Vfb). In this case, the driving at block 402 may include driving the gate of the first transistor with an amplifier (e.g., amplifier 301) such that the feedback voltage at a first input (e.g., negative input) of the amplifier is within an amplifier offset voltage of a reference voltage (Vref) at a second input (e.g., positive input) of the amplifier.

In certain aspects, the third transistor may be a pass transistor (e.g., transistor Mp) of a low-dropout (LDO) regulator (e.g., LDO regulator 300B). In this case, a source of the third transistor may be coupled to an input voltage node (e.g., Vin node) of the LDO regulator, and a drain of the third transistor may be coupled to an output voltage node (e.g., Vout node) of the LDO regulator.

In certain aspects, the second transistor may include a p-type MOSFET. In this case, the third transistor may be a same type of p-type MOSFET as the second transistor, and the second transistor may be disposed adjacent to the third transistor.

Example Aspects

In addition to the various aspects described above, specific combinations of aspects are within the scope of the disclosure, some of which are detailed below:

Aspect 1: A power supply circuit comprising: a first transistor including a source coupled to an input voltage (Vin) node and a drain coupled to an output voltage (Vout) node; a second transistor including a drain coupled to a gate of the first transistor; a third transistor including a drain coupled to the drain of the second transistor and to the gate of the first transistor, wherein a source of the third transistor is coupled to a reference potential node of the power supply circuit; an amplifier including a first input coupled to a reference voltage (Vref) node and an output coupled to a gate of the third transistor; and a voltage offset circuit coupled between the gate of the first transistor and a gate of the second transistor.

Aspect 2: The power supply circuit of Aspect 1, wherein the voltage offset circuit comprises a resistive element coupled between the gate of the first transistor and the gate of the second transistor.

Aspect 3: The power supply circuit of Aspect 1 or 2, wherein the voltage offset circuit comprises at least one of a: a current sink coupled between the gate of the second transistor and a reference potential node; or a current source coupled between a power supply rail and the gate of the first transistor.

Aspect 4: The power supply circuit of any of Aspects 1 to 3, wherein the voltage offset circuit is configured to generate an offset voltage to effectively offset a gate voltage of the second transistor from a gate voltage of the first transistor.

Aspect 5: The power supply circuit of Aspect 4, wherein the offset voltage of the voltage offset circuit is sufficiently high such that a pole associated with the gate of the first transistor is outside a loop bandwidth for the power supply circuit.

Aspect 6: The power supply circuit of any of Aspects 1 to 5, wherein the power supply circuit comprises a low-dropout (LDO) regulator and wherein the first transistor is a pass transistor of the LDO regulator.

Aspect 7: The power supply circuit of any of Aspects 1 to 6, wherein the first transistor comprises a p-type metal-oxide-semiconductor field-effect transistor (MOSFET), wherein the second transistor is a same type of p-type MOSFET as the first transistor, and wherein the second transistor is disposed adjacent to the first transistor.

Aspect 8: The power supply circuit of any of Aspects 1 to 7, further comprising a voltage divider coupled between the Vout node and the reference potential node, wherein a tap of the voltage divider is coupled to a second input of the amplifier.

Aspect 9: A method of supplying power, the method comprising: driving a gate of a first transistor to control a first current in a first branch of a current mirror; generating an offset voltage between a gate and a drain of a second transistor in the first branch of the current mirror; and generating a second current in a second branch of the current mirror based on the first current, wherein a gate voltage of a third transistor in the second branch of the current mirror is higher than a gate voltage of the second transistor by the offset voltage.

Aspect 10: The method of Aspect 9, wherein generating the offset voltage comprises at least one of sinking or sourcing a bias current through a resistive element coupled between the gate and the drain of the second transistor.

Aspect 11: The method of Aspect 9 or 10, further comprising voltage dividing a drain voltage of the third transistor to generate a feedback voltage, wherein the driving comprises driving the gate of the first transistor with an amplifier such that the feedback voltage at a first input of the amplifier is within an amplifier offset voltage of a reference voltage at a second input of the amplifier.

Aspect 12: The method of any of Aspects 9 to 11, wherein the third transistor is a pass transistor of a low-dropout (LDO) regulator, wherein a source of the third transistor is coupled to an input voltage node of the LDO regulator, and wherein a drain of the third transistor is coupled to an output voltage node of the LDO regulator.

Aspect 13: The method of any of Aspects 9 to 12, wherein the second transistor comprises a p-type metal-oxide-semiconductor field-effect transistor (MOSFET), wherein the third transistor is a same type of p-type MOSFET as the second transistor, and wherein the second transistor is disposed adjacent to the third transistor.

Aspect 14: A low-dropout (LDO) voltage regulator comprising a skewed current mirror, wherein: the skewed current mirror is configured to have an offset voltage between a gate of a first transistor in a first branch of the skewed current mirror and a gate of a second transistor in a second branch of the skewed current mirror; and the second transistor is a pass transistor of the LDO voltage regulator.

Aspect 15: The LDO voltage regulator of Aspect 14, wherein the skewed current mirror comprises a resistive element coupled between the gate of the first transistor and the gate of the second transistor.

Aspect 16: The LDO voltage regulator of Aspect 14 or 15, wherein the skewed current mirror comprises at least one of a: a current sink coupled between the gate of the first transistor and a reference potential node; or a current source coupled between a power supply rail and the gate of the second transistor.

Aspect 17: The LDO voltage regulator of any of Aspects 14 to 16, wherein the first transistor comprises a p-type metal-oxide-semiconductor field-effect transistor (MOSFET), wherein the second transistor is a same type of p-type MOSFET as the first transistor, and wherein the second transistor is disposed adjacent to the first transistor.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term “determining” encompasses a wide variety of actions. For example, “determining” may include calculating, computing, processing, deriving, investigating, looking up (e.g., looking up in a table, a database, or another data structure), ascertaining, and the like. Also, “determining” may include receiving (e.g., receiving information), accessing (e.g., accessing data in a memory), and the like. Also, “determining” may include resolving, selecting, choosing, establishing, and the like.

As used herein, a phrase referring to “at least one of” a list of items refers to any combination of those items, including single members. As an example, “at least one of: a, b, or c” is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A power supply circuit comprising:
a first transistor including a source coupled to an input voltage (Vin) node and a drain coupled to an output voltage (Vout) node;
a second transistor including a drain coupled to a gate of the first transistor;
a third transistor including a drain coupled to the drain of the second transistor and to the gate of the first transistor, wherein a source of the third transistor is coupled to a reference potential node of the power supply circuit;
an amplifier including a first input coupled to a reference voltage (Vref) node and an output coupled to a gate of the third transistor; and
a voltage offset circuit coupled between the gate of the first transistor and a gate of the second transistor, and wherein the voltage offset circuit is coupled between the drain of the second transistor and the gate of the second transistor.

2. The power supply circuit of claim 1, wherein the voltage offset circuit comprises a resistive element coupled between the gate of the first transistor and the gate of the second transistor.

3. The power supply circuit of claim 2, wherein the voltage offset circuit further comprises at least one of a:
a current sink coupled between the gate of the second transistor and the reference potential node; or
a current source coupled between a power supply rail and the gate of the first transistor.

4. The power supply circuit of claim 1, wherein the voltage offset circuit is configured to generate an offset voltage to effectively offset a gate voltage of the second transistor from a gate voltage of the first transistor.

5. The power supply circuit of claim 4, wherein the offset voltage of the voltage offset circuit is sufficiently high such that a pole associated with the gate of the first transistor is outside a loop bandwidth for the power supply circuit.

6. The power supply circuit of claim 1, wherein the power supply circuit comprises a low-dropout (LDO) regulator and wherein the first transistor is a pass transistor of the LDO regulator.

7. The power supply circuit of claim 1, wherein the first transistor comprises a p-type metal-oxide-semiconductor field-effect transistor (MOSFET), wherein the second transistor is a same type of p-type MOSFET as the first transistor, and wherein the second transistor is disposed adjacent to the first transistor.

8. The power supply circuit of claim 1, further comprising a voltage divider coupled between the Vout node and the reference potential node, wherein a tap of the voltage divider is coupled to a second input of the amplifier.

9. A method of supplying power, the method comprising:
driving a gate of a first transistor to control a first current in a first branch of a current mirror;
generating an offset voltage between a gate and a drain of a second transistor in the first branch of the current mirror;
generating a second current in a second branch of the current mirror based on the first current, wherein a gate voltage of a third transistor in the second branch of the current mirror is higher than a gate voltage of the second transistor by the offset voltage; and
voltage dividing a drain voltage of the third transistor to generate a feedback voltage, wherein the driving comprises driving the gate of the first transistor with an amplifier such that the feedback voltage at a first input of the amplifier is within an amplifier offset voltage of a reference voltage at a second input of the amplifier.

10. The method of claim 9, wherein generating the offset voltage comprises at least one of sinking or sourcing a bias current through a resistive element coupled between the gate and the drain of the second transistor.

11. The method of claim 9, wherein the third transistor is a pass transistor of a low-dropout (LDO) regulator, wherein a source of the third transistor is coupled to an input voltage node of the LDO regulator, and wherein a drain of the third transistor is coupled to an output voltage node of the LDO regulator.

12. The method of claim 9, wherein the second transistor comprises a p-type metal-oxide-semiconductor field-effect transistor (MOSFET), wherein the third transistor is a same type of p-type MOSFET as the second transistor, and wherein the second transistor is disposed adjacent to the third transistor.

13. A low-dropout (LDO) voltage regulator comprising a skewed current mirror, wherein:
the skewed current mirror is configured to have an offset voltage between a gate of a first transistor in a first branch of the skewed current mirror and a gate of a second transistor in a second branch of the skewed current mirror, and wherein the skewed current mirror is further configured to have the offset voltage between the gate of the first transistor and a drain of the first transistor; and
the second transistor is a pass transistor of the LDO voltage regulator.

14. The LDO voltage regulator of claim 13, wherein the skewed current mirror comprises a resistive element coupled between the gate of the first transistor and the gate of the second transistor.

15. The LDO voltage regulator of claim 14, wherein the skewed current mirror further comprises at least one of a:
a current sink coupled between the gate of the first transistor and a reference potential node; or
a current source coupled between a power supply rail and the gate of the second transistor.

16. The LDO voltage regulator of claim 13, wherein the first transistor comprises a p-type metal-oxide-semiconductor field-effect transistor (MOSFET), wherein the second transistor is a same type of p-type MOSFET as the first transistor, and wherein the second transistor is disposed adjacent to the first transistor.

* * * * *